(12) United States Patent
Kim et al.

(10) Patent No.: US 7,192,833 B2
(45) Date of Patent: Mar. 20, 2007

(54) FLASH MEMORY DEVICE AND METHOD OF MANUFACTURING THE SAME

(75) Inventors: Jae-Hwang Kim, Seoul (KR); Yong-Suk Choi, Seoul (KR); Seung-Beom Yoon, Suwon-si (KR); Yong-Tae Kim, Yongin-si (KR); Young-Sam Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 266 days.

(21) Appl. No.: 11/025,279

(22) Filed: Dec. 29, 2004

(65) Prior Publication Data

US 2005/0153502 A1 Jul. 14, 2005

(30) Foreign Application Priority Data

Dec. 30, 2003 (KR) .................... 10-2003-0100497

(51) Int. Cl.
*H01L 21/336* (2006.01)
(52) U.S. Cl. ................ 438/266; 438/595; 257/E21.682
(58) Field of Classification Search ................ 438/266, 438/267, 595; 257/E21.682
See application file for complete search history.

(56) References Cited

U.S. PATENT DOCUMENTS

| | | | | |
|---|---|---|---|---|
| 6,074,914 A | * | 6/2000 | Ogura | 438/257 |
| 6,228,695 B1 | * | 5/2001 | Hsieh et al. | 438/201 |
| 6,326,662 B1 | * | 12/2001 | Hsieh et al. | 257/316 |

* cited by examiner

*Primary Examiner*—Chandra Chaudhari
(74) *Attorney, Agent, or Firm*—F. Chau & Associates, LLC

(57) ABSTRACT

A flash memory device including a tunnel dielectric layer, a floating gate layer, an interlayer dielectric layer and at least two mold layers formed on a semiconductor substrate and a method of manufacturing the same are provided. By sequentially patterning the layers, a first mold layer pattern and a floating gate layer pattern aligned with each other are formed. Exposed portions of side surfaces of the first mold layer pattern are selectively lateral etched, thereby forming a first mold layer second pattern having grooves in its sidewalls. A gate dielectric layer is formed on the semiconductor substrate adjacent to the floating gate layer pattern. A control gate having a width that is determined by the grooves in the second mold layer pattern is formed on the gate dielectric layer. By removing the first mold layer second pattern, spacers are formed on sidewalls of the control gate. Exposed portions of the interlayer dielectric layer and the floating gate layer pattern are selectively etched, using the spacer as an etch mask to form a floating gate having a width defined by the widths of the groove and spacer.

20 Claims, 6 Drawing Sheets

FLASH MEMORY DEVICE AND METHOD OF MANUFACTURING THE SAME

This application claims the priority of Korean Patent Application No. 2003-100497, filed on Dec. 30, 2003, in the Korean Intellectual Property Office, the disclosure of which is herein incorporated by reference in its entirety.

BACKGROUND OF THE INVENTION

1. Field of the Invention

The present invention relates to a semiconductor device, and more particularly to a flash memory device and a method of manufacturing the same.

2. Description of Related Art

Interest in flash memory devices as nonvolatile memory semiconductor devices has increased recently. A flash memory device uses a floating gate as a charge trapping layer. A proposed flash cell structure includes a split gate in which the width of a floating gate is narrower than that of a control gate disposed on the floating gate.

Such a split gate structure is constructed in a manner such that a charge trapping layer is only defined in a prescribed region below a control gate for the purpose of lowering power dissipation during programming and erasing operations while increasing programming and erasing efficiency. A flash memory device having this structure is formed such that the control gate and charge trapping layer only overlap along a partially defined length.

Problems occurring when manufacturing a typical split gate type flash memory cell will be described with reference to FIG. 1.

FIG. 1 is a sectional view of a flash memory device.

Referring to FIG. 1, a tunnel oxidation layer 21 is formed on a silicon semiconductor substrate 10, and a floating gate 31 is formed as a partially-defined charge trapping layer. An insulating cap layer 23 is formed on the floating gate 31, an oxide-nitride-oxide (ONO) layer 25 is formed on the insulating cap layer 23, and a control gate 35 is formed on the ONO layer 25. The ONO layer 25 acts as an interlayer insulating layer. A source/drain region 40 may be disposed between the floating gates 31.

When forming the flash memory device of split gate of FIG. 1, lengths L1 and L2 of the regions where the ONO layer 25 and the control gate 35 overlap may differ in a first cell and a second cell because of misalignment during a photolithography process. The photolithography process is performed while patterning the control gate 35. Misalignment between the control gate 35 and the underlying floating gate 31 may occur due to a loading effect that can occur during a photolithography process and a misalignment in the photolithography process.

The misalignment induces undesirable characteristic differences between neighboring cells. The misalignment results in different effective lengths of the control gate 35 and the floating gate 31, i.e., the charge trapping layers, in cells. Consequently, the characteristics of the cells are inconsistent.

When forming the floating gate 31 of the flash memory cell, a patterning etch step involving the use of a photoresist pattern is utilized. Here, an edge rounding effect impedes formation of the floating gate 31 with a small dimension.

Therefore, a flash memory device with a structure that can be manufactured without being influenced by photolithography equipment utilized during the photolithography process is needed. More specifically, to effectively and continuously reduce cell size in flash memory devices, a technique capable of preventing the misalignment caused by the photolithography process is needed.

SUMMARY OF THE INVENTION

According to an embodiment of the present disclosure, a flash memory device and a method of manufacturing the same are disclosure wherein characteristic differences between cells caused by misalignment due to a photolithography process are substantially prevented, thus facilitating reduced cell size.

According to an embodiment of the present disclosure, a method of manufacturing a flash memory device comprises forming a tunnel dielectric layer on a semiconductor substrate through which charges tunnel, forming a floating gate layer on the tunnel dielectric layer that traps the tunneled charges, and forming an interlayer dielectric layer that covers the floating gate layer; forming a mold layer comprising at least two layers on the interlayer dielectric layer. The method further comprises sequentially patterning the mold layer, the interlayer dielectric layer and, the floating gate layer, thereby forming a mold layer first pattern, an interlayer dielectric layer pattern and a floating gate layer pattern, which are aligned with one another, selectively lateral etching exposed portions of side surfaces of a certain layer of the mold layer first pattern, the layer being adjacent to the interlayer dielectric layer pattern, thereby forming a mold layer second pattern having grooves in side surfaces thereof, and forming a gate dielectric layer on side surfaces of the floating gate layer pattern and exposed portions of the semiconductor substrate adjacent to the floating gate layer pattern. The method comprises forming a control gate on the gate dielectric layer by filling the grooves in the side surfaces of the mold layer second pattern such that a width filling up the groove is set as a width of a portion overlapping with the floating gate layer pattern, selectively removing the mold layer second pattern, forming spacers on sidewalls of the control gate exposed by the removing of the mold layer second pattern, and forming a floating gate by selectively etching exposed portions of the interlayer dielectric layer and the floating gate layer pattern, using the spacers as an etch mask.

According to an embodiment of the present disclosure, a method for manufacturing a flash memory device comprises forming a tunnel dielectric layer on a semiconductor substrate through which charges tunnel, forming a floating gate layer on the tunnel dielectric layer that traps the tunneled charges, and forming an interlayer dielectric layer that covers the floating gate layer. The method further comprises sequentially forming a first mold layer and a second mold layer having different etch selectivities on the interlayer dielectric layer, sequentially patterning the second mold layer, the first layer, the interlayer dielectric layer, and the floating gate layer, thereby forming a second mold layer first pattern, a first mold layer first pattern, an interlayer dielectric layer pattern and a floating gate layer pattern, which are self-aligned with one another, and selectively lateral etching exposed side surfaces of the first mold layer first pattern, thereby forming a first mold layer second pattern having grooves in side surfaces thereof. The method comprises forming a gate dielectric layer on side surfaces of the floating gate layer pattern and exposed portions of the semiconductor substrate adjacent to the floating gate layer pattern, forming a control gate layer on the gate dielectric layer by filling the grooves in the first mold layer second pattern such that a width filling up the groove is set as a width of a portion overlapping with the floating gate layer pattern, and planarizing the control gate layer, thereby forming a control gate. The method further comprises selectively removing the second mold layer pattern and first mold layer second pattern, forming spacers on sides of the control gate exposed by the removing of the first mold layer second pattern, and forming a floating gate by selectively etching exposed portions of the interlayer dielectric layer and the floating gate layer pattern, using the spacers as an etch mask.

According to an embodiment of the present disclosure, the flash memory device manufacturing method further comprises patterning the floating gate layer in a linear form. The floating gate layer comprises a conductive polysilicon layer. The interlayer dielectric layer comprises a silicon nitride layer. The mold layer includes a stack of a silicon oxide layer and a silicon nitride layer. The silicon oxide layer of the first mold layer is formed by chemical vapor deposition (CVD). Lateral etching for forming the groove is performed by wet etching or chemical dry etching (CDE). The gate dielectric layer comprises a silicon oxide layer formed by thermal oxidation or chemical vapor deposition. The control gate comprises a conductive polysilicon layer. The spacer comprises silicon oxide.

According to an embodiment of the present disclosure, a flash memory device comprises a control gate disposed on a semiconductor substrate, spacers disposed on sidewalls of the control gate; a floating gate disposed under the spacer aligned therewith and having one portion extending under the control gate, a tunnel dielectric layer disposed between the floating gate and the semiconductor substrate through which charge tunneling to the floating gate occurs, a gate dielectric layer disposed between the control gate and the semiconductor substrate and extending onto a side surface of the floating gate, and an interlayer dielectric layer disposed on an upper surface of the floating gate between the control gate and the floating gate.

The flash memory device and the method of manufacturing the same according to an embodiment of the present disclosure prevent characteristic differences in cells resulting from misalignment while performing a photolithography process to facilitate reduced cell size.

According to an embodiment of the present disclosure, a flash memory device comprises a control gate disposed on a semiconductor substrate, a first and second spacer disposed on respective first and second sidewalls of said control gate, and a floating gate disposed under said first spacer aligned with said first spacer and having one portion extending under said control gate. The flash memory device further comprising a lower gate disposed under said second spacer aligned with said second spacer and opposite to said first spacer on said first sidewall of said control gate, a tunnel dielectric layer interposed between said floating gate and said semiconductor substrate and between said lower gate and said semiconductor substrate through which charge tunneling to said floating gate occurs, a gate dielectric layer disposed between said control gate and said semiconductor substrate and extending onto a side surfaces of said floating gate, and an interlayer dielectric layer disposed on an upper surface of said floating gate between said control gate and floating gate. The first and second spacers comprise a silicon oxide layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

FIGS. 2 through 11 are sectional views illustrating a method of manufacturing a flash memory device according to an embodiment of the present disclosure.

Figure 1:
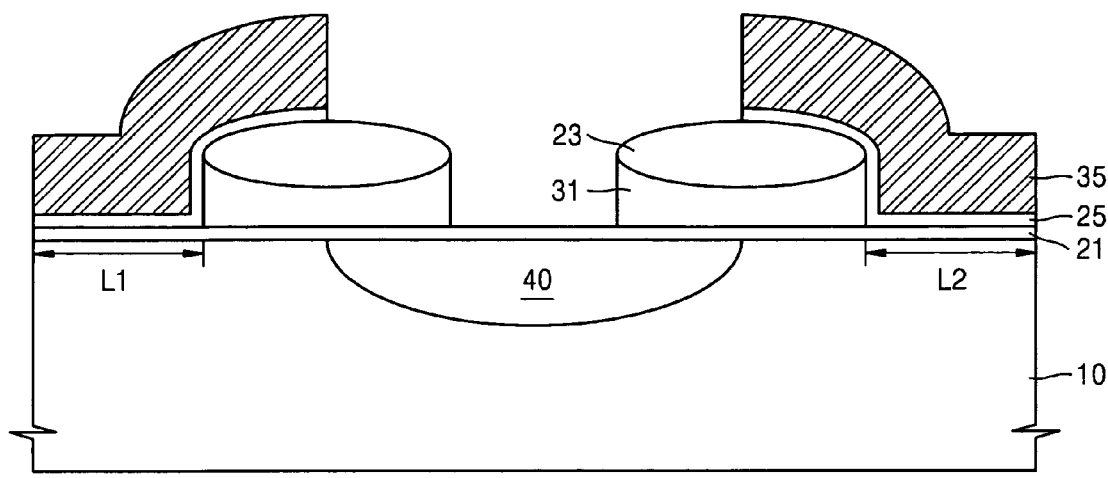
FIG. 1 is a sectional view of a flash memory device.
Figure 2:
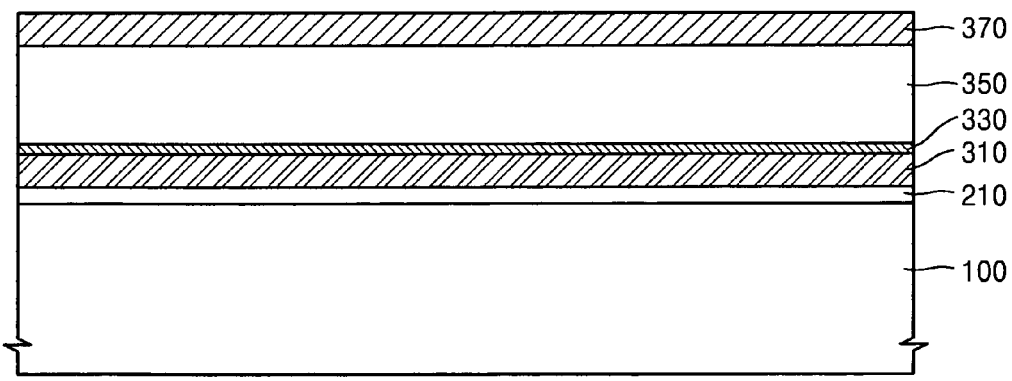
FIGS. 2 through 11 are sectional views illustrating a method of manufacturing a flash memory device according to an embodiment of the present disclosure.

Referring to FIG. 2, a tunnel dielectric layer 210 is formed on a semiconductor substrate 100, e.g., a silicon substrate.

The tunnel dielectric layer 210 is included such that charges, such as electrons, tunnel therethrough while programming or erasing the flash memory device. The tunnel dielectric layer 210 may be formed of an oxide layer by thermal oxidation, e.g., a thermal oxide or a Chemical Vapor Deposition (CVD) oxide. Preferably, the tunnel dielectric layer 210 includes a silicon oxide layer formed by thermal oxidation. The tunnel dielectric layer 210 is formed having a thickness that allows the tunnelling of the charges, e.g., to a thickness of about 50 to 100 Å.

A floating gate layer 310 is formed on the tunnel dielectric layer 210. The floating gate layer 310 acts as a charge trapping layer later, which traps the charges tunnelling through the tunnel dielectric layer 210. The floating gate layer 310 may be formed of a conductive layer, e.g., a conductive polysilicon layer, with a thickness of approximately 300 to 500 Å.

Because such a conductive polysilicon layer is employed as a floating gate in a succeeding process, it may be subjected to a patterning process for forming the floating gate. The conductive polysilicon layer pattern extending horizontally may be used as a floating gate layer 310.

An interlayer dielectric layer 330 is formed on floating gate layer 310. The interlayer dielectric layer 330 may be formed of layers acting as dielectric layers between the floating gate and the control gate in the flash memory device. For example, it may be formed by growing a silicon nitride layer to a thickness of about 100 to 200 Å by CVD.

First and second mold layers 350 and 370 to be used as a mold in patterning processes are sequentially formed on the interlayer dielectric layer 330. The first mold layer 350 has etching selectively to the second mold layer 370.

For example, the first mold layer 350 may be formed of a silicon oxide layer to a thickness of about 500 to 1000 Å by CVD. An insulating material, e.g., silicon nitride layer, having etching selectively to the silicon oxide is formed thereon to a thickness of 200 to 300 Å, which is thinner than the first mold layer 350, to be used as the second mold layer 370. Such a silicon nitride layer may be deposited by CVD.

When considering a subsequent removal process, the first mold layer 350 is preferably formed of the silicon oxide. Accordingly, the interlayer dielectric layer 330 is formed of a silicon nitride layer, or the like, which has etching selectively to the first mold layer 350.

Figure 3:
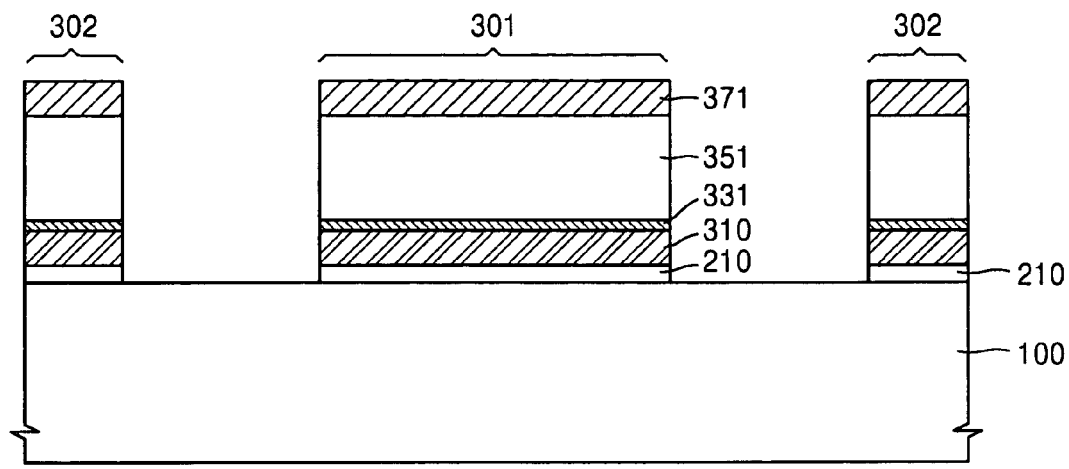

Referring to FIG. 3, an etch mask (not shown) is formed on the second mold layer 370. Using the etch mask, the structure of FIG. 2 is patterned down to the semiconductor substrate 100. A photoresist pattern may be used as the etch mask.

A second mold layer pattern 371, a first mold layer pattern 351, an interlayer dielectric layer pattern 331, a floating gate layer pattern 310 and a tunnel dielectric layer pattern 210, which are self-aligned with one another, are formed by selective etching exposed regions using the etch mask. The selective etching may be anisotropic dry etching.

The middle stack in FIG. 3 is designated as a first stack 301, and stacks adjacent to the first stack 301 are designated as second stack 302.

Figure 4:
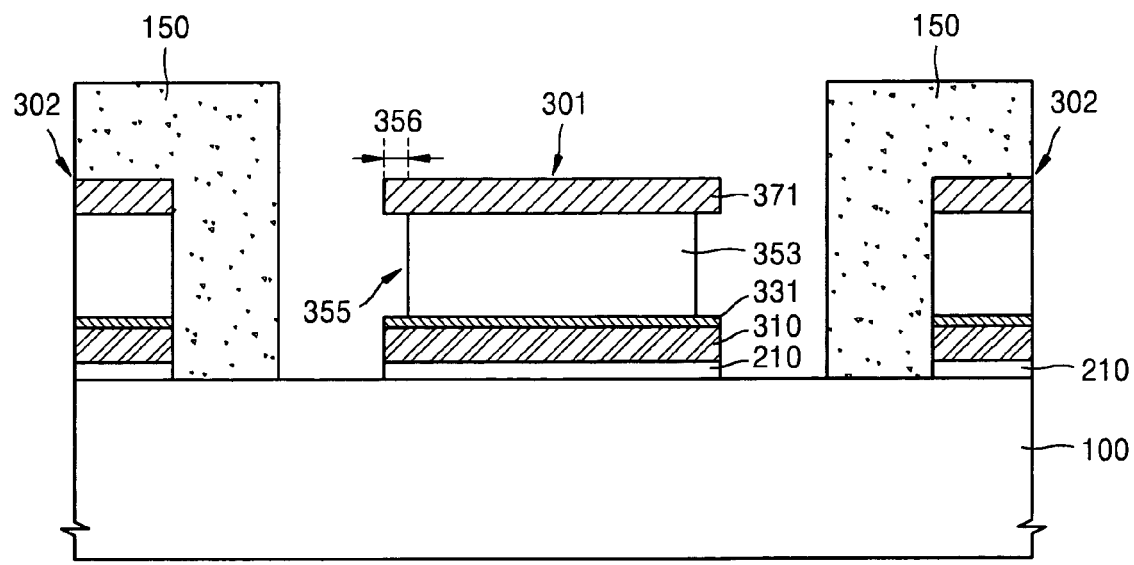

Referring to FIG. 4, exposed side surfaces of the first mold layer pattern 351 are etched to form a third mold layer pattern 353, thereby forming a groove 355 recessed a predetermined depth into the side surface.

Lateral etching is performed on the first stack 301 selectively with respect to the second mold layer pattern 371, the interlayer dielectric layer pattern 331, the floating gate layer pattern 310, and the tunnel dielectric layer pattern 210, thereby selectively etching the first mold layer pattern 351. The lateral etching may be carried out by wet etching or chemical dry etching (CDE) that provides a sufficient etch selectivity between silicon oxide and silicon nitride.

Since both of the exposed side surfaces of the first mold layer pattern 351 are substantially identical, the etching process performed on both side surfaces brings about substantially identical results. Accordingly, widths 356, obtained by recessing both side surfaces of the first mold layer pattern 351, are substantially equal. The dimensions of grooves 355 are substantially the same. By controlling the time of the lateral etching, the widths 356 can be adjusted as desired.

Therefore, the first mold layer second pattern 353 has a width that depends on the widths 356. Thus, the second mold layer pattern 371 protrudes from both sides of the first mold layer second pattern 353. The interlayer dielectric layer pattern 331 is preferably formed of a silicon nitride layer so as to protrude from both sides of the first mold layer second pattern 353.

The floating gate layer pattern 310 is preferably formed of polysilicon, thus protruding from both sides of the first mold layer second pattern 353 due to the etch selectivity between the polysilicon and silicon oxide. The width of the protruding portion of the floating gate layer pattern 310, e.g., the width corresponding to the width 356 of the groove 355, is set by a width by which the floating gate and control gate overlap in a subsequent process.

The groove 355 is selectively formed in the first stack 301, and the two second stacks 302 are shielded by a photoresist pattern 150. This is so that a lower gate opposite to a floating gate in a flash memory device of split gate type below a control gate is formed such that the lower gate has a different width than the floating gate, e.g., narrower than the floating gate.

While the groove 355 is being formed, a portion of the tunnel dielectric layer 210 formed on semiconductor substrate 100 adjoined to the floating gate layer pattern 310 may be degraded or lost. Thus, the dielectric layer needs to be repeatedly grown or the degraded portion needs to be cured.

Figure 5:
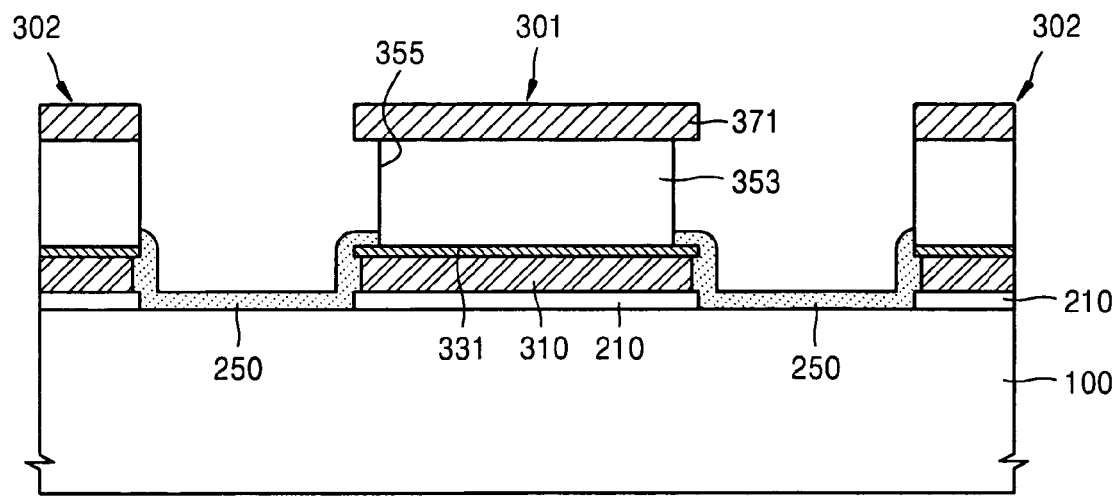

Referring to FIG. 5, after removing the photoresist pattern 150, a gate dielectric layer 250 is formed on the floating gate layer pattern 310 and exposed portions of the semiconductor substrate 100 by CVD or thermal oxidation. The thermal oxidation and CVD may be combined or individually performed to form a silicon oxide layer for the gate dielectric layer 250. When forming the gate dielectric layer 250, the CVD can be performed after executing the thermal oxidation so as to sufficiently shield edges of the floating gate layer pattern 310.

The gate dielectric layer 250 is interposed between the control gate formed in a subsequent process and the semiconductor substrate 100.

Figure 6:
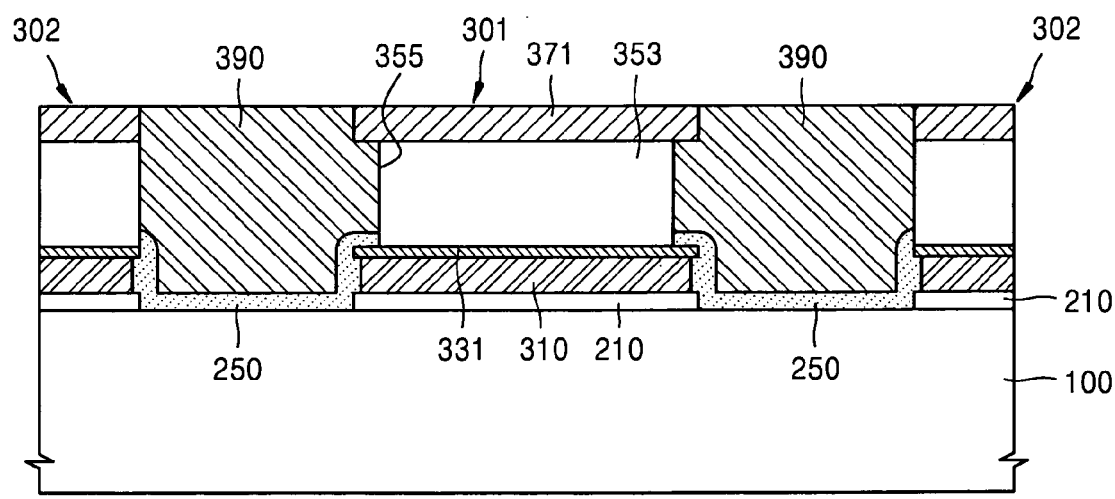

Referring to FIG. 6, a conductive material layer, e.g., a conductive polysilicon layer, is deposited on the gate dielectric layer 250 and fills the grooves 355, thereby forming a control gate layer 390.

The control gate layer 390 may be formed by CVD, or the like, such that the grooves 335 are sufficiently filled. It is also preferable to deposit a polycrystalline silicon layer having desirable gap fill characteristic as the control fate layer 390. The control gate layer 390 is planarized to form a control gate 390. The second layer pattern 371 may be utilized as an end point of Chemical Mechanical Polishing (CMP), a preferable method for the planarization.

Figure 7:
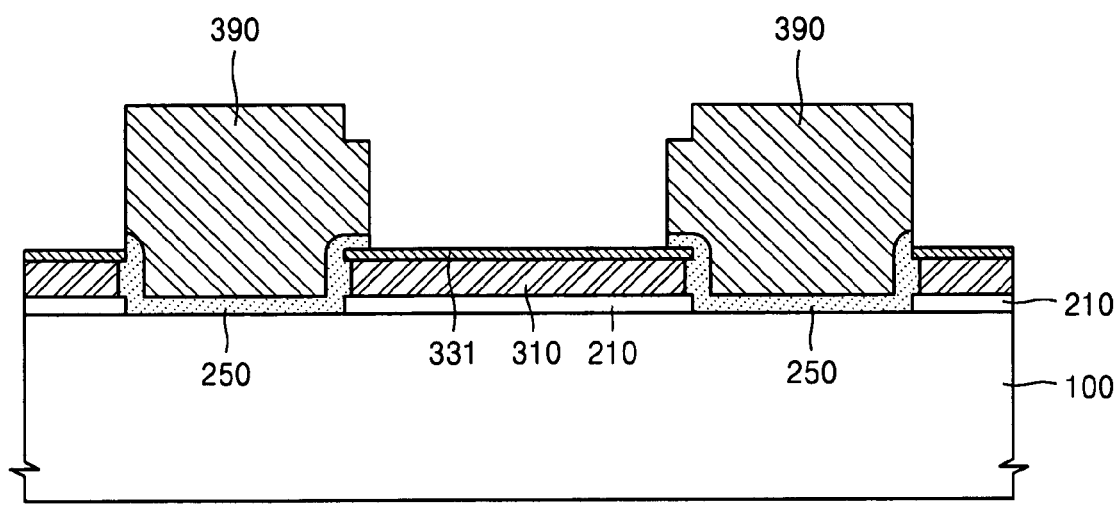

Referring to FIG. 7, the second and third mold layer patterns 371 and 353 are selectively removed by wet or dry etching. The interlayer dielectric layer pattern 331 immediately below the third mold layer pattern 353 may be utilized as an end point of the etching.

The control gate 390 and the floating gate layer pattern 310 overlap each other as much as the widths of the grooves 355. Since the grooves 355 have substantially identical dimensions, the widths of the overlapping portions are substantially identical. Therefore, the problems of flash memory devices resulting from inconsistent characteristics of different cells due to misalignment caused during photolithography processes are substantially avoided.

Figure 8:
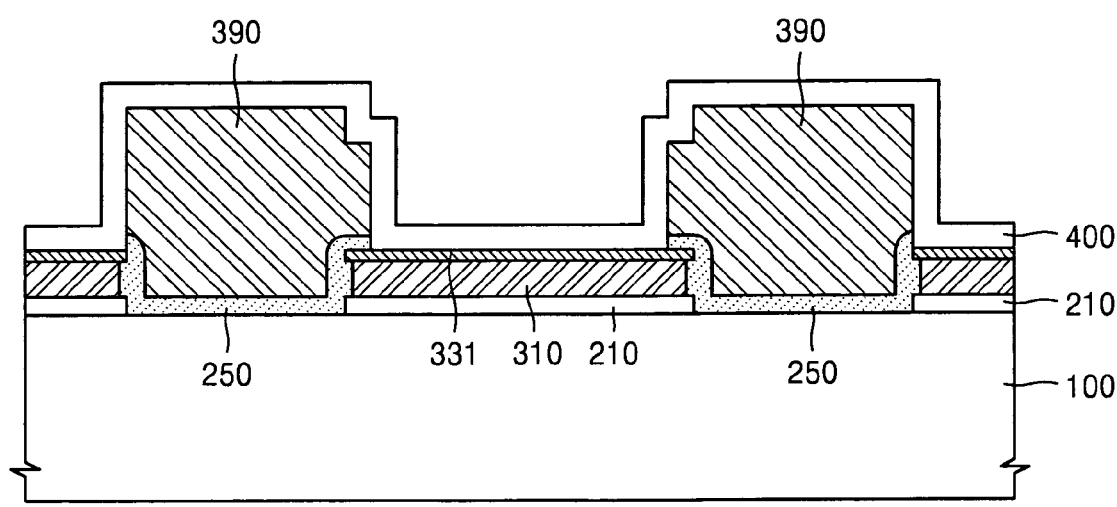

Referring to FIG. 8, a spacer layer 400 is formed of a CVD silicon oxide layer, etc., to a thickness of about 500 to 1000 Å.

Figure 9:
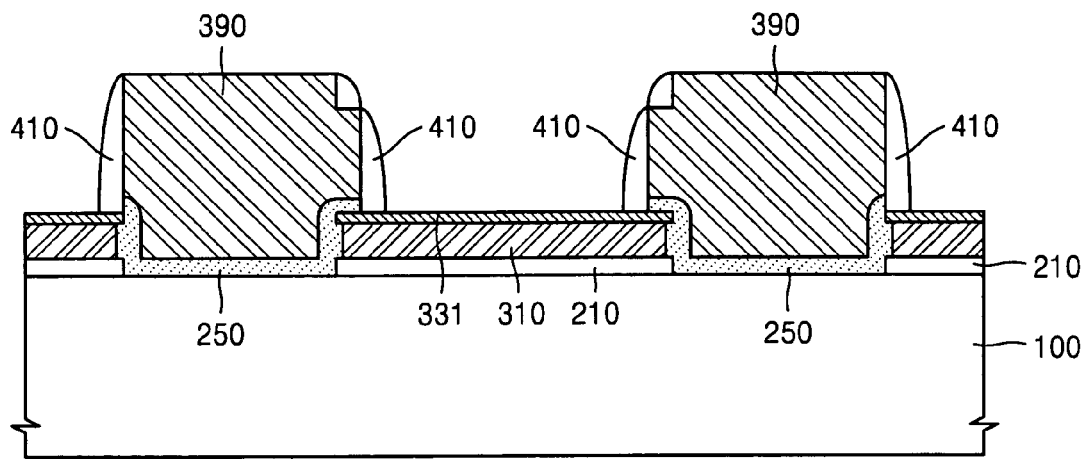

Referring to FIG. 9, a spacer 410 is formed of the spacer layer 400 using reactive ion etching (RIE), dry etching, or the like.

Figure 10:
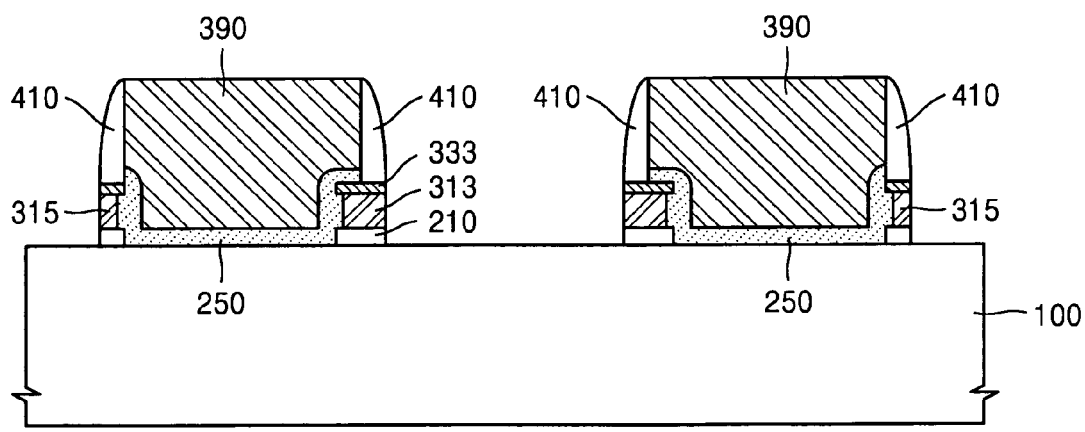

Referring to FIG. 10, exposed portions of the interlayer dielectric layer pattern 331, the floating gate layer pattern 310 and the tunnel dielectric layer 210 are sequentially etched using the spacer 410 as an etch mask, thereby forming a floating gate 313 and a lower gate 315 disposed on opposite sides of the control gate 390. Since the patterning of the floating gate 313 and the lower gate 315 utilizes the spacer 410 as the etch mask, the floating gate 313 and the lower gate 315 are aligned with the spacer 410, and their widths depend on the width of spacer 410.

The width of the spacer 410 is adjusted by controlling the thickness of spacer layer 400 during deposition. Thus, widths of the floating gate 313 and the lower gate 315 can be precisely controlled. Since the width of the floating gate 313 is adjusted in accordance with the width of the spacer 410 and dimension of groove 355, the width of the floating gate 313 can be accurately controlled by controlling the dimensions of the groove 355 and the width of the spacer 410.

Since the photolithography process is excluded, the characteristics differences between cells due to misalignment caused by the photolithography process are substantially prevented.

Figure 11:
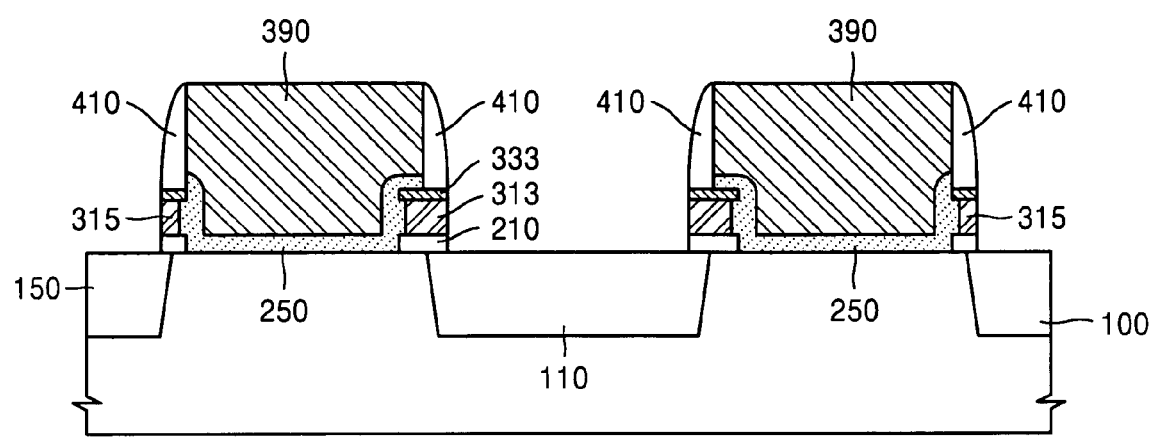

Referring to FIG. 11, a source region 110 and a drain region 150 are formed in the semiconductor substrate 100 adjacent to the control gate 390 by implanting n-type impurities. For example, an ion implantation mask such as a photoresist pattern can be used to implant the n-type impurities, thereby forming the drain region 150. Another ion implantation mask can be used to implant the n-type impurities, thereby forming the source region 110.

A silicide layer may be formed on the source/drain regions 110 and 150 and the control gate 390 by selective silicidation. This silicide layer is introduced to decrease a resistance, and may be formed of tungsten silicide ($WSi_x$), cobalt silicide ($CoSi_x$), titanium silicide ($TiSi_x$), or the like.

After forming the insulating layer, contacts electrically connected to the drain region 150 and the source region 110 are formed, thus forming the flash device. The lower gate 315 is connected to a word line (not shown) to allow a programming operation to be performed at a much lower voltage.

The width of the floating gate can be formed precisely. Furthermore, by excluding the photolithography process while forming the control gate, characteristic differences between cells because of misalignment can be substantially prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a flash memory device comprises:
    forming a tunnel dielectric layer on a semiconductor substrate through which charges tunnel;
    forming a floating gate layer on said tunnel dielectric layer that traps tunneled charges;
    forming an interlayer dielectric layer that covers said floating gate layer;
    forming a mold layer comprising at least two layers on said interlayer dielectric layer;
    patterning sequentially said mold layer, said interlayer dielectric layer and, said floating gate layer, thereby forming a mold layer first pattern, an interlayer dielectric layer pattern and a floating gate layer pattern, which are aligned with one another;
    etching laterally exposed portions of side surfaces of the mold layer first pattern being adjacent to said interlayer dielectric layer pattern, thereby forming a mold layer second pattern having grooves in side surfaces thereof;
    forming a gate dielectric layer on side surfaces of said floating gate layer pattern and exposed portions of said semiconductor substrate adjacent to said floating gate layer pattern;
    forming a control gate on said gate dielectric layer by filling said grooves in the side surfaces of said mold layer second pattern such that a width filling said groove is set as a width of a portion overlapping with said floating gate layer pattern;
    selectively removing said mold layer second pattern;
    forming spacers on sidewalls of said control gate exposed by said removing of said mold layer second pattern; and
    forming a floating gate by selectively etching exposed portions of said interlayer dielectric layer and said floating gate layer pattern, using said spacers as an etch mask.

2. The method of manufacturing a flash memory device as claimed in claim 1, further comprising patterning said floating gate layer in a linear form.

3. The method of manufacturing a flash memory device as claimed in claim 1, wherein said floating gate layer comprises a conductive polysilicon layer.

4. The method of manufacturing a flash memory device as claimed in claim 1, wherein said interlayer dielectric layer comprises a silicon nitride layer.

5. The method of manufacturing a flash memory device as claimed in claim 1, wherein said forming of mold layer comprises sequentially forming a silicon oxide layer and a silicon nitride layer.

6. The method of manufacturing a flash memory device as claimed in claim 5, wherein said silicon oxide layer is formed by chemical vapor deposition (CVD).

7. The method of manufacturing a flash memory device as claimed in claim 1, wherein said lateral etching for forming said groove is performed by wet etching or chemical dry etching (CDE).

8. The method of manufacturing a flash memory device as claimed in claim 1, wherein said gate dielectric layer comprises a silicon oxide layer formed by thermal oxidation or chemical vapor deposition.

9. The method of manufacturing a flash memory device as claimed in claim 1, wherein said control gate comprises a conductive polysilicon layer.

10. The method of manufacturing a flash memory device as claimed in claim 1, wherein said spacer comprises silicon oxide.

11. A method of manufacturing a flash memory device comprises:
    forming a tunnel dielectric layer on a semiconductor substrate through which charges tunnel;
    forming a floating gate layer on said tunnel dielectric layer that traps tunneled charges;
    forming an interlayer dielectric layer that covers said floating gate layer;
    forming a mold layer comprising at least two layers on said interlayer dielectric layer;
    patterning sequentially said mold layer, said interlayer dielectric layer, and said floating gate layer, thereby forming first and second stacks, each of said stacks comprising a mold layer first pattern, an interlayer dielectric layer pattern and a floating gate layer pattern, which are aligned with one another, said first stack being adjacent to said second stack;
    etching laterally exposed portions of side surfaces of the mold layer first pattern being adjacent to said interlayer dielectric layer pattern of said second stack while shielding side surfaces of said first stack, thereby forming a mold layer second pattern having grooves in the side surfaces thereof in the second stack;
    forming a gate dielectric layer on side surfaces of said floating gate layer pattern and exposed portions of said semiconductor substrate adjacent to said floating gate layer pattern;
    forming a control gate layer on said gate dielectric layer by filling said grooves in the side surfaces of said mold layer second pattern such that a width filling said groove is set as a width of a portion overlapping with said floating gate layer pattern;
    planarizing said control gate layer, thereby forming a control gate;
    removing selectively said mold layer second pattern;
    forming spacers on sides of said control gate exposed by said removing of said of mold layer second pattern;
    forming a floating gate by selectively etching exposed portions of said interlayer dielectric layer and said floating gate layer pattern, using said spacers as an etch mask; and
    forming a lower gate with a width set by said spacer wherein said lower gate and said floating gate are disposed on opposite sides of said control gate.

12. The method of manufacturing a flash memory device as claimed in claim 11, wherein said forming said mold layer comprises forming sequentially a silicon oxide layer and a silicon nitride layer.

13. The method of manufacturing a flash memory device as claimed in claim 11, wherein said spacer comprises silicon oxide.

14. A method of manufacturing a flash memory device comprises:
- forming a tunnel dielectric layer on a semiconductor substrate through which charges tunnel;
- forming a floating gate layer on said tunnel dielectric layer that traps tunneled charges;
- forming an interlayer dielectric layer that covers said floating gate layer;
- forming sequentially a first mold layer and a second mold layer having different etch selectivities on said interlayer dielectric layer;
- patterning sequentially said second mold layer, said first layer, said interlayer dielectric layer, and said floating gate layer, thereby forming a second mold layer first pattern, a first mold layer first pattern, an interlayer dielectric layer pattern and a floating gate layer pattern, which are self-aligned with one another;
- etching laterally exposed side surfaces of said first mold layer first pattern, thereby forming a first mold layer second pattern having grooves in side surfaces thereof;
- forming a gate dielectric layer on side surfaces of said floating gate layer pattern and exposed portions of said semiconductor substrate adjacent to said floating gate layer pattern;
- forming a control gate layer on said gate dielectric layer by filling said grooves in said first mold layer second pattern such that a width filling said groove is set as a width of a portion overlapping with said floating gate layer pattern;
- planarizing said control gate layer, thereby forming a control gate;
- removing selectively said second mold layer pattern and first mold layer second pattern;
- forming spacers on sides of said control gate exposed by said removing of said first mold layer second pattern; and
- forming a floating gate by selectively etching exposed portions of said interlayer dielectric layer and said floating gate layer pattern, using said spacers as an etch mask.

15. The method of manufacturing a flash memory device as claimed in claim 14, wherein said first mold layer comprises a silicon oxide layer.

16. The method of manufacturing a flash memory device as claimed in claim 15, wherein said silicon oxide layer is deposited by chemical vapor deposition (CVD).

17. The method of manufacturing a flash memory device as claimed in claim 15, wherein said second mold layer comprises a silicon nitride layer on said silicon oxide layer by chemical vapor deposition (CVD).

18. The method of manufacturing a flash memory device as claimed in claim 17, wherein said planarizing of said control gate layer comprises chemical mechanical polishing (CMP), using said silicon nitride layer as an end point of said planarizing.

19. The method of manufacturing a flash memory device as claimed in claim 14, wherein said spacer comprises a silicon oxide.

20. A method of manufacturing a flash memory device comprises:
- forming a tunnel dielectric layer on a semiconductor substrate through which charges tunnel;
- forming a floating gate layer on said tunnel dielectric layer that traps tunneled charges;
- forming an interlayer dielectric layer that covers said floating gate layer;
- forming sequentially a first mold layer comprising a silicon oxide layer and a second mold layer comprising a silicon nitride layer on said interlayer dielectric layer;
- patterning sequentially said second mold layer pattern, said first mold layer, said interlayer dielectric layer, and said floating gate layer, thereby forming first and second stacks each of said stacks comprising a second mold layer pattern, a first mold layer first pattern, an interlayer dielectric layer pattern and a floating gate layer pattern, which are aligned with one another, said first stack being adjacent to said second stack;
- etching laterally exposed side surfaces of said first mold layer first pattern of said second stack while shielding side surfaces of said first stack, thereby forming a first mold layer second pattern having grooves in the side surfaces thereof in the second stack;
- forming a gate dielectric layer on side surfaces of said floating gate layer pattern and exposed portions of said semiconductor substrate adjacent to said floating gate layer pattern;
- forming a control gate layer on said gate dielectric layer by filling said grooves in said first mold layer second pattern such that a width filling up said groove is set as a width of a portion overlapping with said floating gate layer pattern;
- planarizing said control gate layer, thereby forming a control gate;
- removing selectively said second mold layer pattern and said first mold layer second pattern;
- forming spacers on sides of said control gate exposed by said removing of said first mold layer second pattern;
- forming a floating gate by selectively etching exposed portions of said interlayer dielectric layer and said floating gate layer pattern, using said spacers as an etch mask; and
- forming a lower gate with a width set by said spacer, wherein said lower gate and said floating gate are disposed on opposite sides of said control gate.

* * * * *